United States Patent
Suzuki et al.

(10) Patent No.: US 9,803,107 B2
(45) Date of Patent: Oct. 31, 2017

(54) POLISHING AGENT, POLISHING METHOD AND METHOD FOR MANUFACTURING SEMICONDUCTOR INTEGRATED CIRCUIT DEVICE

(71) Applicant: ASAHI GLASS COMPANY, LIMITED, Chiyoda-ku (JP)

(72) Inventors: Masaru Suzuki, Tokyo (JP); Toshihiko Otsuki, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 15/040,661

(22) Filed: Feb. 10, 2016

(65) Prior Publication Data
US 2016/0237316 A1    Aug. 18, 2016

(30) Foreign Application Priority Data

Feb. 12, 2015 (JP) .................................. 2015-025638
Oct. 28, 2015 (JP) .................................. 2015-211386

(51) Int. Cl.
*H01L 21/3105* (2006.01)
*C09G 1/02* (2006.01)

(52) U.S. Cl.
CPC .......... *C09G 1/02* (2013.01); *H01L 21/31053* (2013.01)

(58) Field of Classification Search
CPC ........................... C09G 1/02; H01L 21/31053
See application file for complete search history.

(56) References Cited

U.S. PATENT DOCUMENTS

| 7,071,105 B2 | 7/2006 | Carter et al. |
| 7,442,645 B2 | 10/2008 | Carter et al. |
| 8,486,169 B2 | 7/2013 | Carter et al. |
| 2006/0144824 A1 | 7/2006 | Carter et al. |
| 2008/0070412 A1* | 3/2008 | Yoshida .............. B24B 37/0056 438/693 |
| 2008/0188162 A1* | 8/2008 | Kobata ................... B23H 5/08 451/8 |

FOREIGN PATENT DOCUMENTS

JP   2006-520530   9/2006
WO   WO 2004/069947 A1   8/2004

* cited by examiner

*Primary Examiner* — Duy Deo
*Assistant Examiner* — Mahmoud Dahimene
(74) *Attorney, Agent, or Firm* — Oblon, McClelland, Maier & Neustadt, L.L.P.

(57) ABSTRACT

The present invention relates to a polishing agent including: cerium oxide particles; a water-soluble polyamine; potassium hydroxide; at least one selected from an organic acid and a salt thereof; and water, in which the polishing agent has a pH of 10 or more, a polishing method using the polishing agent, and a method for manufacturing a semiconductor integrated circuit device.

15 Claims, 2 Drawing Sheets

POLISHING AGENT, POLISHING METHOD AND METHOD FOR MANUFACTURING SEMICONDUCTOR INTEGRATED CIRCUIT DEVICE

FIELD OF THE INVENTION

The present invention relates to a polishing agent, a polishing method, and a method for manufacturing a semiconductor integrated circuit device. Particularly, the present invention relates to a polishing agent for chemical mechanical polishing in the manufacturing of a semiconductor integrated circuit, a polishing method using the polishing agent, and a method for manufacturing a semiconductor integrated circuit device.

BACKGROUND OF THE INVENTION

In recent years, with high integration and high functionality of a semiconductor integrated circuit, the development of microfabrication technology for miniaturization and density growth of a semiconductor element is advancing. In the manufacturing of a semiconductor integrated circuit device (hereinafter also referred to as a "semiconductor device"), in order to prevent the problem such that unevenness (difference in level) of the surface of a layer exceeds depth of focus of lithography and sufficient resolution is not obtained, it is conventionally performed to flatten an interlayer insulating film, an embedding wiring and the like using chemical mechanical polishing (hereinafter referred to as "CMP"). Importance of high flattening by CMP is increasing with severer requirements of high definition and miniaturization of an element.

Furthermore, in recent years, in the manufacturing of a semiconductor device, an isolation method by shallow trench having small element isolation width (Shallow Trench Isolation; hereinafter referred to as "STI") is introduced in order to proceed with higher miniaturization of a semiconductor element.

Figure 1A:
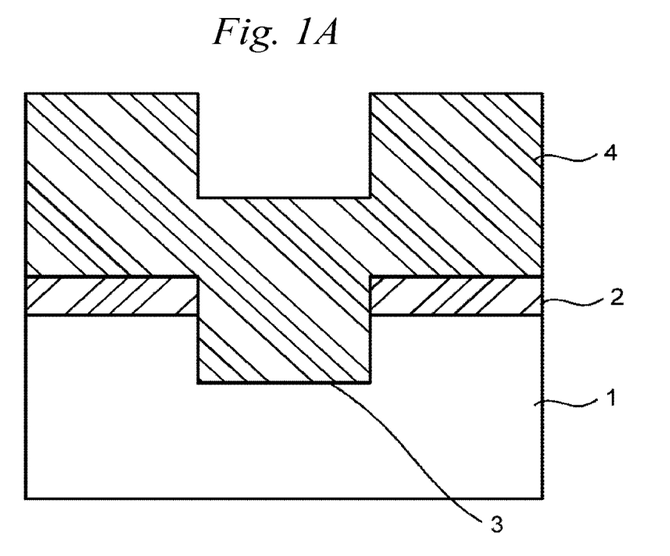
FIGS. 1A and 1B are cross-sectional views of a semiconductor substrate showing a polishing method by CMP in STI.
Figure 1B:
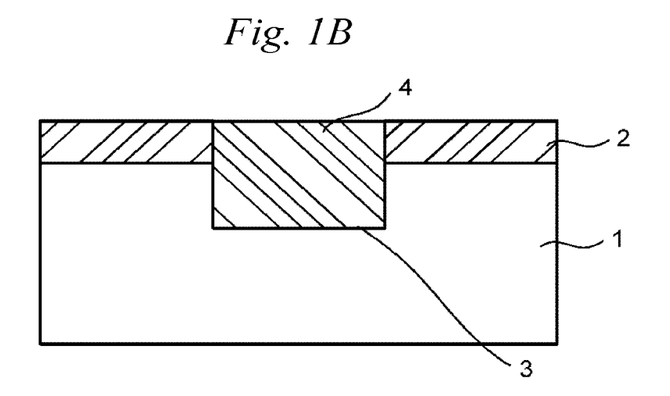

The STI is a technique for forming an electrically insulated element region by forming a trench (groove) on a silicon substrate and embedding an insulating film in the trench. In the STI, as shown in FIG. 1A, an element region of a silicon substrate 1 is masked with a silicon nitride film 2 or the like, a trench 3 is formed on the silicon substrate 1, and an insulating film such as a silicon dioxide film 4 is then deposited so as to embed the trench 3. The silicon dioxide film 4 on the silicon nitride film 2 as a convex part is polished and removed by CMP while remaining the silicon dioxide film 4 in the trench 3 as a concave part. Thus, an element isolation structure having the silicon dioxide film 4 embedded in the trench 3 is obtained as shown in FIG. 1B.

In CMP in the STI, the progress of polishing can be stopped at the time when a silicon nitride film has been exposed, by increasing a selection ratio between a silicon dioxide film and a silicon nitride film (the selection ratio means a ratio between a removal rate of the silicon dioxide film and a removal rate of the silicon nitride film, and is hereinafter also simply referred to as a "selection ratio"). In a polishing method using a silicon nitride film as a stopper film, smoother surface can be obtained as compared with the ordinary polishing method.

In CMP technology in recent years, not only high removal rate to a silicon dioxide film is required from the standpoint of cost, but also height of the selection ratio described above is becoming important.

A method for improving polishing characteristics of a polishing agent is conventionally proposed. Patent Document 1 discloses a polishing agent containing cerium oxide particles as abrasives, and an amine such as aliphatic amine and heterocyclic amine, or a carboxylic acid such as aminocarboxylic acid, cyclic monocarboxylic acid and unsaturated monocarboxylic acid.

However, in the polishing agent disclosed in Patent Document 1, high value is secured to a certain degree in a removal rate of a silicon dioxide film, but the suppression of a removal rate of a silicon nitride film is not sufficient. Therefore, it did not say that the selection ratio between a silicon dioxide film and a silicon nitride film is sufficiently high. For this reason, flatness of polishing was not sufficient.

Patent Document 1: JP-T-2006-520530 (WO2004/069947)

SUMMARY OF THE INVENTION

The present invention has been made to solve the above-described problems, and has an object to provide a polishing agent and a polishing method that can keep low removal rate to a silicon nitride film and achieve high selection ratio and satisfactory flatness while maintaining sufficiently high removal rate to a silicon oxide film such as a silicon dioxide film.

A polishing agent of the present invention includes: cerium oxide particles; a water-soluble polyamine; potassium hydroxide; at least one selected from an organic acid and a salt thereof; and water, and has a pH of 10 or more.

In the polishing agent of the present invention, it is preferable that the water-soluble polyamine is a water-soluble polyether polyamine having a weight average molecular weight of from 100 to 2,000. It is preferable that the water-soluble polyamine is contained in an amount of from 0.001 to 2.0 mass % based on a total amount of the polishing agent. It is preferable that the organic acid is a monocarboxylic acid, and that the organic acid is gluconic acid or N-[tris(hydroxymethyl)methyl]glycine. It is preferable that the at least one selected from the organic acid and the salt thereof is contained in an amount of from 0.001 to 2.0 mass % based on the total amount of the polishing agent. It is preferable that the potassium hydroxide is contained in an amount of from 0.001 to 2.0 mass % based on the total amount of the polishing agent. It is preferable that the cerium oxide particles are contained in an amount of from 0.01 to 5.0 mass % based on the total amount of the polishing agent.

A polishing method of the present invention is a polishing method including: supplying a polishing agent to a polishing pad, and bringing the polishing pad into contact with a surface to be polished of a semiconductor integrated circuit device to perform polishing by relative movement therebetween, in which the surface to be polished includes a surface including silicon oxide, and the polishing agent is the polishing agent of the present invention.

A method for manufacturing a semiconductor integrated circuit device of the present invention includes a step of polishing a surface to be polished, by the polishing method of the present invention.

In the present invention, the term "surface to be polished" is a surface to be polished of an object to be polished, and means, for example, the surface. In the present specification, a surface in an intermediate stage appearing on a semiconductor substrate in the process of manufacturing a semiconductor device is also included in the "surface to be polished". Furthermore, "silicon oxide" is specifically silicon dioxide, but the invention is not limited to only silicon dioxide, and includes silicon oxide other than silicon dioxide.

According to the polishing agent and polishing method of the present invention, low removal rate to a silicon nitride film can be kept and polishing in which a selection ratio between a silicon oxide film and the silicon nitride film is high can be achieved, while maintaining sufficiently high removal rate to the silicon oxide film, for example, in CMP of a surface to be polished which includes a surface including silicon oxide in STI.

DETAILED DESCRIPTION OF THE INVENTION

An embodiment of the present invention is described below. However, the present invention is not limited to the following embodiment, and other embodiments can be included in the scope of the present invention so long as those conform to the gist of the present invention.

Polishing Agent

The polishing agent of the present invention includes cerium oxide particles, a water-soluble polyamine, potassium hydroxide, an organic acid and/or a salt thereof and water, and has a pH of 10 or more.

When the polishing agent of the present invention is used in, for example, CMP of a surface to be polished including a silicon oxide film (for example, silicon dioxide film) in STI, high removal rate to a silicon oxide film can be obtained. Additionally, since a removal rate to a silicon nitride film can be suppressed to a sufficiently low level, high selection ratio can be obtained. Furthermore, polishing with high flatness can be achieved.

The mechanism that the polishing agent of the present invention exhibits such excellent polishing characteristics is not clear, but it is considered to be due to that the polishing agent contains a water-soluble polyamine, an organic acid and/or a salt thereof, and potassium hydroxide. That is, it is considered to be due to that the water-soluble polyamine and the organic acid and/or a salt thereof are electrostatically adsorbed on the surface of the cerium oxide particles and the surface to be polished including the silicon oxide film through terminal groups (acid groups such as an amino group of the water-soluble polyamine, and a carboxyl group of the organic acid) of the respective molecules in the pH region of 10 or more in which potassium hydroxide present. It is considered that the effects of adsorption on the surface of cerium oxide particles and the effect of adsorption on the surface to be polished including the silicon oxide film and the like are optimized, and as a result, both high removal rate to the silicon oxide film and high selection ratio between the silicon oxide film and the silicon nitride film can be achieved without impairing dispersibility of cerium oxide particles.

Each component contained in the polishing agent of the present invention and pH of slurry are described below.

Cerium Oxide Particles

The cerium oxide particles contained in the polishing agent of the present invention have a function as abrasives for polishing. Although the kind of the cerium oxide particles contained is not particularly limited, cerium oxide particles produced by the method described in, for example, JP-A-11-12561 or JP-A-2001-35818 can be used. Specifically, the present invention can use cerium oxide particles obtained by adding an alkali to a cerium nitrate (IV) ammonium aqueous solution to prepare a cerium hydroxide gel, followed by filtering, cleaning and burning, or cerium oxide particles obtained by pulverizing high purity cerium carbonate, and then burning, followed by further pulverizing and classifying. Cerium oxide particles obtained by chemically oxidizing cerium (III) salt in a liquid, as described in JP-T-2010-505735, also can be used.

The cerium oxide particles have an average particle size of preferably from 0.01 to 0.5 μm, and more preferably from 0.03 to 0.3 μm. In case where the average particle size thereof exceeds 0.5 μm, polishing flaws such as scratches are likely to be generated on the surface to be polished. On the other hand, in case where the average particle size thereof is less than 0.01 μm, removal rate is likely to be decreased. Additionally, since a surface area per unit volume is large, the cerium oxide particles are easy to receive the influence of surface state, and become easy to aggregate depending on the conditions such as a pH and a concentration of an additive.

The cerium oxide particles are present as aggregates (secondary particles) in which primary particles have been aggregated in a liquid. Therefore, the preferred average particle size of the cerium oxide particles described above is represented by an average secondary particle size. Specifically, the cerium oxide particles have an average secondary particle size of preferably from 0.01 to 0.5 and more preferably from 0.03 to 0.3 μm.

The average secondary particle size is measured with a particle size analyzer of laser diffraction/scattering type or the like using a dispersion having particles dispersed in a dispersion medium such as pure water.

The content (hereinafter also referred to as a "concentration") of the cerium oxide particles is preferably from 0.01 to 5.0 mass % based on the total amount of the polishing agent. Particularly preferred content thereof is from 0.15 to 0.5 mass %. When the content of the cerium oxide particles is from 0.01 to 5.0 mass %, sufficiently high removal rate to a silicon oxide film can be obtained. Additionally, since a viscosity of the polishing agent is not so high, handling properties are satisfactory.

Cerium oxide particles in the state of previously being dispersed in a medium (cerium oxide particle dispersion) may be used as the cerium oxide particles of the present invention. In such a case, water is preferably used as the medium. In dispersing, a dispersion treatment may be applied using an appropriate dispersant. As the dispersant that can be contained in the cerium oxide particle dispersion, a water-soluble organic polymer, an anionic surfactant or the like, which are described hereinafter as the dispersant that can be added to the polishing agent, can be preferably used.

Water

Water is contained in the polishing agent of the present invention as a medium for dispersing cerium oxide particles and for dissolving a water-soluble polyamine, an organic acid and the like described hereinafter. The kind of water is not particularly limited, but considering the influence to components to be contained in the polishing agent, prevention of contamination by impurities, the influence to pH and the like, pure water, ultrapure water, ion-exchanged water and the like are preferably used.

Water-Soluble Polyamine

In the polishing agent of the present invention, the water-soluble polyamine is contained for the improvement of a removal rate to a silicon oxide film and the improvement of a selection ratio between a silicon oxide film and a silicon nitride film. Chemical structure of the water-soluble polyamine is not particularly limited and may be any structure so long as the water-soluble polyamine is a water-soluble compound having two or more amino groups in one molecule thereof. The term "water-soluble" used herein means that the compound completely dissolves in a polishing agent in a concentration used as a polishing agent. The degree of dissolution (solubility) is not limited so long as the compound is in such a state. Generally, a compound that dissolves in pure water in an amount of 1 mass % of more, and preferably 5 mass % or more is called a "water-soluble" compound.

Specifically, the water-soluble polyamine is preferably at least one selected from the group consisting of a water-soluble polyether polyamine, a water-soluble polyalkylene polyamine, a water-soluble polyethyleneimine, a water-soluble polyvinylamine, a water-soluble polyarylamine, a water-soluble polylysine and a water-soluble chitosan. Particularly preferred water-soluble polyamine is a water-soluble polyether polyamine and a water-soluble polyalkylene polyamine.

Weight average molecular weight of the water-soluble polyamine is not limited so long as the polyamine has water solubility. The water-soluble polyamine has a weight average molecular weight of preferably from 100 to 100,000, and more preferably from 100 to 2,000. In case where the weight average molecular weight of the water-soluble polyamine is less than 100, the effect of addition of the water-soluble polyamine is small. In case where the weight average molecular thereof weight exceeds 100,000, it may adversely affect properties such as fluidity of a polishing agent even though the polyamine is water-soluble. Furthermore, when the weight average molecular weight thereof exceeds 2,000, solubility in pure water is decreased in some cases. Therefore, particularly preferred weight average molecular weight of the water-soluble polyamine is from 100 to 2,000. In other words, the water-soluble polyether polyamine and the water-soluble polyalkylene polyamine, having a weight average molecular weight of from 100 to 2,000 are particularly preferred as the water-soluble polyamine.

In the present description, the expression "from . . . to . . ." showing the numerical range is used to mean that the numerical values after "from" and "to" are included as the lower limit and the upper limit, respectively.

The polyether polyamine used herein means a compound having two or more amino groups and two or more ethereal oxygen atoms in the molecule thereof. The amino group may be a secondary amino group (—NH—) or a tertiary amino group, but a primary amino group (—NH$_2$) is more preferred. Specifically, the polyether polyamine is preferably a compound having two or more primary amino groups in the molecule thereof and substantially not having other amino groups, and particularly preferably polyether diamine having two primary amino groups only in the molecule thereof. Additionally, a compound having a structure in which a hydrogen atom in a hydroxyl group of polyhydric alcohol or polyether polyol is substituted with an aminoalkyl group is also preferred as the polyether polyamine.

The polyalkylene polyamine used herein means a compound having a structure in which three or more amino groups are bonded through the respective alkylene groups. It is preferred that an amino group at the terminal of a molecule is a primary amino group, and it is preferred that an amino group in the middle part of a molecule is a secondary amino group. More preferred polyalkylene polyamine is a linear polyalkylene polyamine having primary amino groups at both terminals of a molecule and having one or more secondary amino groups in the middle part of a molecule. Two or more bonding parts including an alkylene group sandwiched between two amino groups are present in one molecule. Those bonding parts between amino groups may be the same or different from each other. It is preferred that those bonding parts are the same, or two bonding parts between amino groups, bonded to primary amino groups at both terminals are the same and are different from other bonding parts between amino groups. It is preferred that the number of carbon atoms contained in one bonding part between amino groups is from 2 to 8. Particularly, it is preferred that the number of carbon atoms contained in two bonding parts between amino groups, bonded to primary amino groups at both terminals is from 2 to 8 and the number of carbon atoms contained in other bonding parts between amino groups is from 2 to 6.

The polyether diamine and polyalkylene polyamine described above are preferably a compound having a structure represented by the following formula (1):

$$H_2N-(R-X)_k-R-NH_2 \tag{1}$$

in which R represents an alkylene group having from 2 to 8 carbon atoms, X represents an oxygen atom or —NH—, k is an integer of 2 or more when the compound is polyether diamine and an integer of 1 or more when the compound is polyalkylene polyamine. Rs in one molecule may be the same or different from each other.

The polyether diamine is particularly preferably a compound represented by the following formula (2), and the polyalkylene polyamine is particularly preferably a compound represented by the following formula (3):

$$H_2N-R^2-O-(R^1-O)_m-R^2-NH_2 \tag{2}$$

$$H_2N-R^4-NH-(R^3-NH)_n-R^4-NH_2 \tag{3}$$

in which $R^1$ represents an ethylene group or a propylene group, $R^2$ represents an alkylene group having from 2 to 6 carbon atoms, $R^3$ represents an alkylene group having from 2 to 6 carbon atoms, $R^4$ represents an alkylene group having from 2 to 8 carbon atoms, m is an integer of 1 or more, and n is an integer of 1 or more. $R^1$ and $R^2$ may be the same or different from each other, and $R^3$ and $R^4$ may be the same or different from each other.

Examples of the specific polyether diamine represented by the formula (2) include polyoxypropylene diamine (a compound in which each of $R^1$ and $R^2$ is a propylene group and m is 1 or more), polyoxyethylene diamine (a compound in which each of $R^1$ and $R^2$ is an ethylene group and m is 1 or more) and 4,7,10-trioxa-tridecane-1,13-diamine (a compound in which $R^1$ is an ethylene group, $R^2$ is a trimethylene group, and m is 2).

Examples of the specific polyalkylene polamine represented by the formula (3) include tetraethylene pentamine (a compound in which each of $R^3$ and $R^4$ is an ethylene group and n is 2), pentaethylene hexamine (a compound in which each of $R^3$ and $R^4$ is an ethylene group and n is 3), heptaethylene octamine (a compound in which each of $R^3$ and $R^4$ is an ethylene group and n is 5), N,N'-bis(3-aminopropyl)-ethylenediamine (a compound in which $R^3$ is an ethylene group, $R^4$ is a trimethylene group, and n is 1) and N,N'-bis(2-aminoethyl)-1,4-butanediamine (a compound in which $R^3$ is a tetramethylene group, $R^4$ is an ethylene group, and n is 1).

To obtain sufficiently high removal rate to a silicon oxide film, the content (concentration) of the water-soluble polyamine is preferably from 0.001 to 2.0 mass %, and more preferably from 0.01 to 0.2 mass %, based on the total amount of the polishing agent.

Organic Acid and/or Salt Thereof

The polishing agent of the present invention contains an organic acid and/or a salt thereof. When the organic acid and/or the salt thereof is contained under the basic condition having a pH of 10 or more as in the polishing agent of the present invention, the improvement in a selection ratio of a removal rate between a silicon oxide film and a silicon nitride film is achieved.

The mechanism of the improvement in a selection ratio is not clear, but it is considered that a hydration reaction and a hydroxylation reaction are accelerated under the basic condition having a pH of 10 or more as in the polishing agent of the present invention, as compared with an acidic condition, particularly those reactions tend to occur in cerium oxide particles, a silicon oxide film and a silicon nitride film, but the organic acid has a function to inhibit the hydration reaction and hydroxylation reaction under the basic condition having a pH of 10 or more. Additionally, cerium oxide is easy to change to cerium hydroxide under the basic condition having a pH of 10 or more. The cerium oxide particles have properties that a removal rate to a silicon oxide film is high and a selection ratio between a silicon oxide film and a silicon nitride film is high. On the other hand, the cerium hydroxide has a low removal rate to a silicon oxide film as compared with cerium oxide, whereby a selection ratio between a silicon oxide film and a silicon nitride film is decreased. It is considered that the organic acid used in the present invention deposits on the surface of the cerium oxide particles, thereby inhibiting change into cerium hydroxide on the surface of the cerium oxide particles under the basic condition having a pH of 10 or more, and as a result, the improvement in a selection ratio between a silicon oxide film and a silicon nitride film is achieved.

The surface of a silicon nitride film becomes a surface state similar to the surface of a silicon oxide film by a hydration reaction under the basic condition having a pH of 10 or more, and this tends to invite the decrease of a selection ratio between a silicon oxide film and a silicon nitride film. It is considered that the organic acid achieves the improvement in a selection ratio between a silicon oxide film and a silicon nitride film by disturbing the hydration reaction.

Examples of the organic acid contained in the polishing agent of the present invention include a carboxylic acid, an organic sulfonic acid and an organic phosphoric acid. In the polishing agent of the present invention, a carboxylic acid is preferred as the organic acid. Preferred carboxylic acids are exemplified below, but the present invention is not limited to those. In each of groups (1) to (8), carboxylic acids exemplified in the groups before the corresponding groups are excluded.

(1) Saturated aliphatic monocarboxylic acid: acetic acid, propionic acid, butylic acid, valeric acid and caproic acid (2) Carboxylic acid having heterocyclic ring containing nitrogen atom (nitrogen-containing heterocyclic ring) (monocarboxylic acid, polycarboxylic acid): 2-pyridinecarboxylic acid, 3-pyridinecarboxylic acid, 4-pyridinecarboxylic acid, 2,3-pyridinedicarboxylic acid, 2,4-pyridinedicarboxylic acid, 2,5-pyridinedicarboxylic acid, 2,6-pyridinedicarboxylic acid, 3,4-pyridinedicarboxylic acid, 3,5-pyridinedicarboxylic acid, pyradinecarboxylic acid, 2,3-pyradinecarboxylic acid, 2-quinoline carboxylic acid (quinaldic acid), pyrrolidonecarboxylic acid (pyroglutamic acid) and DL-pipecolic acid (3) Carboxylic acid having heterocyclic ring containing hetero atom other than nitrogen: 2-furancarboxylic acid, 3-furancarboxylic acid, tetrahydrofurane-2-carboxylic acid and tetrahydrofuran-2,3,4,5-tetracarboxylic acid (4) Carboxylic acid having amino group (amino acid or the like): alanine, glycine, glycylglycine, aminobutylic acid, N-acetylglycine, N,N-di(2-hydroxyethyl)glycine, N-(tert-butoxycarbonyl)glycine, proline, trans-4-hydroxy-L-proline, phenylalanine, sarcosine, hydantoic acid, creatine, creatine hydrate, N-[tris(hydroxymethyl)methyl]glycine, glutamic acid and aspartic acid

(5) Carboxylic acid having hydroxyl group (hydroxycarboxylic acid or the like): lactic acid, malic acid, citric acid, tartaric acid, glycolic acid, gluconic acid, salicylic acid, 2-hydroxyisobutylic acid, glyceric acid, 2,2-bis(hydroxymethyl)propionic acid and 2,2-bis(hydroxymethyl)butylic acid (6) Carboxylic acid having ketone group (keto acid): pyruvic acid, acetoacetic acid and levulinic acid (7) Carboxylic acid having saturated hydrocarbon ring (alicyclic hydrocarbon ring): cyclopentanecarboxylic acid, cyclohexanecarboxylic acid and cycloheptanecarboxylic acid (8) Carboxylic acid other than the above: oxalic acid, malonic acid, succinic acid, fumaric acid, maleic acid, glutaric acid, adipic acid and phthalic acid Of those carboxylic acids, monocarboxylic acids having one carboxyl group are more preferred. Of the monocarboxylic acids, gluconic acid represented by the formula: $CH_2(OH)CH(OH)CH(OH)CH(OH)COOH$ or N-[tris(hydroxymethyl)methyl]-glycine (hereinafter referred to as "tricine") represented by the following formula (4) is particularly preferred.

(4)

Those organic acids can be used in the form of a salt. Examples of the salt of the organic acid include a secondary or tertiary ammonium salt, a quaternary ammonium salt, an alkali metal salt such as a potassium salt, and an organic amine salt.

The content (concentration) of the organic acid and/or the salt thereof is preferably from 0.001 to 2.0 mass %, in terms of the sum of the organic acid and the salt thereof, based on the total amount of the polishing agent. When the content falls within the above-described range, the effects of the suppression of a removal rate to a silicon nitride film and the improvement in a selection ratio between a silicon oxide film and a silicon nitride film are sufficiently obtained, and dispersion stability of the cerium oxide particles as abrasives is satisfactory. The content (concentration) of the organic acid and/or the salt thereof is more preferably from 0.001 to 0.2 mass %.

Potassium Hydroxide

The polishing agent of the present invention contains potassium hydroxide. When the polishing agent of the present invention containing the water-soluble polyamine contains potassium hydroxide, high removal rate to a silicon oxide film is obtained.

The mechanism that a removal rate to a silicon oxide film is improved by containing potassium hydroxide is not clear, but it is considered that potassium hydroxide has the effect of separating a part of the water-soluble polyamine stuck to a silicon oxide film, from the silicon oxide film. Potassium hydroxide has basicity far stronger than that of the water-soluble polyamine, and has the property of more strongly sticking to the surface of the silicon oxide film having negative surface charge than the water-soluble polyamine. Furthermore, potassium hydroxide is present in the form of a potassium ion when sticking, but the potassium ion has small ionic radius, and does not disturb that cerium oxide particles come into contact with the surface of the silicon oxide film. As a result, it is considered that a removal rate to the silicon oxide film is improved by the addition of potassium hydroxide. An organic amine such as ammonia, monoethanolamine or ethylenediamine, that is a material having weak basicity as compared with potassium hydroxide, is insufficient in the effect of separating the water-soluble polyamine from the surface of the silicon oxide film. Furthermore, in the case of using quaternary ammonium hydroxide such as tetramethylammonium hydroxide and tetraethylammonium hydroxide, an ionic radius of a quaternary ammonium ion is larger than that of a potassium ion. Therefore, the cerium oxide particles are disturbed from coming into contact with the surface of the silicon oxide film. Furthermore, in case where sodium hydroxide or lithium hydroxide is contained in the polishing agent, there is a possibility of adverse influence to a semiconductor substrate as an object to be polished, which is not preferred.

To obtain high removal rate to a silicon oxide film, the content (concentration) of the potassium hydroxide is preferably from 0.001 to 2.0 mass %, and more preferably from 0.001 to 0.2 mass %, based on the total amount of the polishing agent.

pH

The polishing agent of the present invention has a pH of 10 or more. When the polishing agent has the pH of 10 or more, the effects of the improvement in a removal rate to a silicon oxide film and the improvement in a selection ratio between a silicon oxide film and a silicon nitride film are obtained, and dispersion stability of the cerium oxide particles as abrasives is satisfactory. The pH of the polishing agent is preferably from 10 to 13, and more preferably 11 to 12. The pH of a liquid slightly varies depending on a liquid temperature. Therefore, the pH of the polishing agent is a pH at 25° C.

The polishing agent of the present invention may contain various inorganic acids or inorganic acid salts as a pH regulator to adjust the pH thereof to a predetermined value of 10 or more. The inorganic acid or inorganic acid salt as a pH regulator is not particularly limited. Examples of the inorganic acid that can be used include nitric acid, sulfuric acid, hydrochloric acid and phosphoric acid, and examples of the inorganic acid salt that can be used include an ammonium salt and potassium salt of the acids.

A basic compound other than the potassium hydroxide may be further added as a pH regulator to the polishing agent of the present invention. The basic compound as a pH regulator is preferably water-soluble, but is not particularly limited thereto. Examples of the basic compound that can be used include ammonia, quaternary ammonium hydroxide such as tetramethylammonium hydroxide and tetraethylammonium hydroxide, and an organic amine such as monoethanolamine and ethylenediamine.

Other than above-described components, a dispersant can be contained in the polishing agent of the present invention. The dispersant is used to stably disperse the cerium oxide particles in a dispersion medium such as pure water. The dispersant is preferably a water-soluble organic polymer or an anionic surfactant. The water-soluble organic polymer is preferably a polymer having a carboxylic acid group, an ammonium salt of carboxylic acid, or the like, and particularly preferably a polyacrylic acid or a polyacrylic acid salt.

Furthermore, a lubricant, a thickener or viscosity regulator, a preservative and the like can be appropriately contained in the polishing agent of the present invention as necessary.

Preparation Method of Polishing Agent

To prepare the polishing agent of the present invention, for example, a method of adding the water-soluble polyamine, the organic acid and/or a salt thereof, and potassium hydroxide to the dispersion obtained by dispersing the cerium oxide particles in water such as pure water or ion-exchanged water, followed by mixing is used. Uniform polishing agent can be obtained by stirring for a predetermined period of time using a stirrer or the like. Furthermore, further satisfactory dispersion state can be obtained by using an ultrasonic disperser after the mixing.

The polishing agent of the present invention is not always required to be provided in the polishing site as a mixture obtained by previously mixing all of polishing constituent components. The polishing agent may be prepared to have a composition for a polishing agent by separately providing each polishing component to the polishing site and mixing those in the polishing site.

Polishing Method

The polishing method according to an embodiment of the present invention is a polishing method including bringing a polishing pad into contact with a surface to be polished of an object to be polished while supplying the polishing agent described above to perform the polishing by relative movement therebetween. The surface to be polished on which the polishing is performed is, for example, a surface which includes a surface including silicon dioxide of a semiconductor substrate. As the semiconductor substrate, the substrate for STI described above is exemplified as a preferred example. The polishing agent of the present invention is effective in the polishing for flattening an interlayer insulating film between multilayer wirings in the manufacturing of a semiconductor device.

The silicon dioxide film in a substrate for STI includes a so-called PE-TEOS film obtained by film formation with a plasma CVD method using tetraethoxysilane (TEOS) as a raw material. The silicon dioxide film further includes a so-called HDP film obtained by film formation with a high density plasma CVD method. The silicon nitride film includes a film obtained by film formation with a low pressure CVD method or a plasma CVD method using silane or dichlorosilane, and ammonia as raw materials.

Polishing Machine

Figure 2:
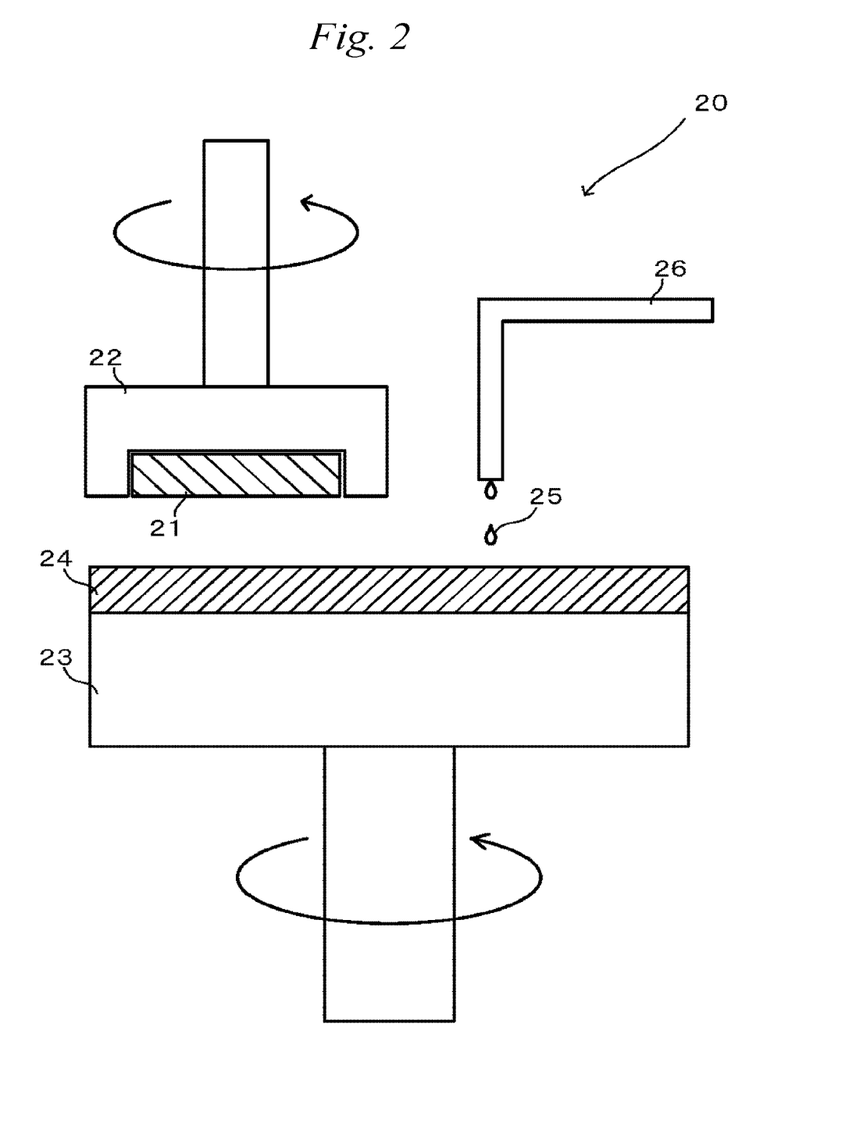
FIG. 2 is a view showing one example of a polishing machine usable in the polishing method of the present invention.

The polishing method according to the embodiment of the present invention can use the conventional polishing machine. FIG. 2 is a view showing one example of a polishing machine usable in the polishing method of the present invention.

This polishing machine 20 includes a polishing head 22 for holding a semiconductor substrate 21 such as an STI substrate, a polishing platen 23, a polishing pad 24 stuck onto the surface of the polishing platen 23, and a polishing agent supply tube 26 for supplying a polishing agent 25 to the polishing pad 24. The polishing machine is constituted such that the surface to be polished of the semiconductor substrate 21 held by the polishing head 22 is brought into contact with the polishing pad 24 while supplying the polishing agent 25 by the polishing agent supply tube 26, and the polishing head 22 and the polishing platen 23 are relatively rotated to perform polishing. The polishing machine used in the embodiment of the present invention is not limited to this structure.

The polishing head 22 may perform not only rotation movement, but also linear movement. The polishing platen 23 and the polishing pad 24 may have a size equivalent to or smaller than the size of the semiconductor substrate 21. In this case, it is preferred to relatively move the polishing head 22 and the polishing platen 23, thereby making it possible to polish the entire surface of the surface to be polished of the semiconductor substrate 21. The polishing platen 23 and the polishing pad 24 may not perform rotation movement, but may move, for example, in one direction by a belt system.

The polishing conditions of the polishing machine 20 are not particularly limited. However, polishing pressure is increased by applying a load to the polishing head 22 to press the polishing head to the polishing pad 24, and, as a result, removal rate can be improved. The polishing pressure is preferably from about 0.5 to 50 kPa, and from the standpoints of uniformity of the removal rate in the surface to be polished of the semiconductor substrate 21, flatness and prevention of polishing defects such as scratches, the polishing pressure is more preferably from about 3 to 40 kPa. The number of rotations of the polishing platen 23 and the polishing head 22 is preferably from about 50 to 500 rpm, but is not limited to this range. The supply amount of the polishing agent 25 is appropriately adjusted by a composition of the polishing agent, polishing conditions described above, and the like.

As the polishing pad 24, a pad including a nonwoven fabric, a foamed polyurethane, a porous resin, a non-porous resin or the like may be used. The hardness of the polishing pad 24 is not particularly limited. From the standpoint of reduction in polishing flaws, lower hardness is preferred, and specifically, Shore D of less than 40 is preferred. To accelerate the supply of the polishing agent 25 to the polishing pad 24 or to allow a certain amount of the polishing agent 25 to stay in the polishing pad 24, groove processing such as a lattice shape, a concentric shape or a helical shape may be applied to the surface of the polishing pad 24. Furthermore, as necessary, a pad conditioner may be brought into contact with the surface of the polishing pad 24, and the polishing may be performed while conditioning the surface of the polishing pad 24.

According to the polishing method of the present invention, in CMP treatment such as flattening of an interlayer insulating film or flattening of an insulating film for STI in the manufacturing of a semiconductor device, the surface to be polished including silicon oxide (for example, silicon dioxide) can be polished in high removal rate. Additionally, high selection ratio between a silicon oxide film and a silicon nitride film can be achieved.

EXAMPLES

The present invention is specifically described below by reference to working examples and comparative examples, but the invention should not be construed as being limited to those examples. Examples 1 to 3 are working examples, and Examples 4 to 9 are comparative examples. In the following examples, unless otherwise indicated, "%" means "mass %". Characteristic values were measured and evaluated by the following methods.

pH

The pH was measured using a pH meter 1-M-30R manufactured by DKK-TOA Corporation.

Average Particle Size

The average particle size is an average secondary particle size, and was measured using a laser diffraction/scattering particle size distribution analyzer (manufactured by Horiba, Ltd, device name: LA-950).

Polishing Characteristics

The polishing characteristics were evaluated using a fully automatic CMP polishing machine (manufactured by Applied Materials, device name: Mirra). Two-layer pad (manufactured by Rodel, trade name: IC-1400, K-groove) was used as the polishing pad, and diamond pad conditioner (manufactured by 3M, trade name: A165) was used for conditioning the polishing pad. The polishing conditions were polishing pressure: 21 kPa, the number of rotations of polishing platen: 77 rpm, and the number of rotations of polishing head: 73 rpm. Furthermore, the supply rate of the polishing agent was 200 ml/min.

A silicon dioxide film-attached blanket substrate in which a silicon dioxide film has been formed on an 8-inch silicon wafer by plasma CVD using tetraethoxysilane as a raw material, and a silicon nitride film-attached blanket substrate in which a silicon nitride film has been formed on an 8-inch silicon wafer by CVD were used as a polishing object (an object to be polished), respectively.

A film thickness meter UV-1280SE manufactured by KLA-Tencor was used for the measurement of a film thickness of the silicon dioxide film and silicon nitride film, formed on the above-described blanket substrates. The respective removal rates of the silicon dioxide film and the silicon nitride film were calculated by obtaining the difference between the film thickness before polishing and the film thickness after polishing for 1 minute of those blanket substrates. An average value (nm/min) of the removal rate obtained from removal rates at 49 places on the surface of the substrate was obtained, and was used as an evaluation index of the removal rate.

Furthermore, the ratio between the removal rate of the silicon dioxide film and the removal rate of the silicon nitride film (removal rate of silicon dioxide film/removal rate of silicon nitride film) was calculated as a selection ratio.

Example 1

Cerium oxide particles and ammonium polyacrylate having a weight average molecular weight of 5,000 as a dispersant in a mass ratio of 100:0.7 were added to deionized water, and those were mixed by stirring, followed by ultrasonic dispersing and filtering. Thus, a cerium oxide particle dispersion having a concentration of the cerium oxide particles of 10% and a concentration of the dispersant of 0.07% (hereinafter referred to as a "cerium oxide dispersion A") was prepared. The average secondary particle size of the cerium oxide particles was 0.19 μm.

Polyether polyamine having a weight average molecular weight of 230 as a water-soluble polyamine (manufactured by BASF, trade name: Polyetheramine D-230) (hereinafter referred to as a "polyetheramine a"), potassium hydroxide and gluconic acid as an organic acid were added to deionized water, and were dissolved therein by stirring and mixing.

The resulting solution was mixed with the cerium oxide dispersion A. Thus, a polishing agent (1) having a concentration of the cerium oxide particles of 0.25%, a concentration of the polyetheramine a of 0.12%, a concentration of the potassium hydroxide of 0.024% and a concentration of the gluconic acid of 0.032%, based on the total amount of the polishing agent was prepared. The pH of the polishing agent (1) was 11.4 as shown in Table 1.

Example 2

A solution obtained by adding the polyetheramine a, potassium hydroxide and gluconic acid to deionized water, followed by stirring and mixing was mixed with the cerium oxide dispersion A such that the respective components have the concentrations shown in Table 1, in the same manner as in Example 1. Thus, a polishing agent (2) was obtained. The pH of the polishing agent (2) was 11.3 as shown in Table 1.

Example 3

The polyetheramine a, potassium hydroxide and N-[tris(hydroxymethyl)-methyl]glycine (shown as "tricine" in Table 1) as an organic acid were added to deionized water, and were dissolved therein by stirring and mixing. This solution was mixed with the cerium oxide dispersion A such that the respective components have the concentrations shown in Table 1, in the same manner as in Example 1. Thus, a polishing agent (3) was obtained. The pH of the polishing agent (3) was 11.0 as shown in Table 1.

Example 4

A polishing agent was prepared without adding an organic acid. Specifically, a solution obtained by adding the polyetheramine a and potassium hydroxide to deionized water and dissolving those in the deionized water was mixed with the cerium oxide dispersion A such that the respective components have the concentrations shown in Table 1. Thus, a polishing agent (4) was obtained. The pH of the polishing agent (4) was 11.0 as shown in Table 1.

Example 5

A polishing agent was prepared without adding potassium hydroxide. Specifically, a solution obtained by adding the polyetheramine a and gluconic acid to deionized water and dissolving those in the deionized water was mixed with the cerium oxide dispersion A such that the respective components have the concentrations shown in Table 1. Thus, a polishing agent (5) was obtained. The pH of the polishing agent (5) was 10.4 as shown in Table 1.

Example 6

A solution obtained by adding the polyetheramine a, potassium hydroxide and gluconic acid to deionized water and dissolving those in the deionized water was mixed with the cerium oxide dispersion A such that the respective components have the concentrations shown in Table 1. Thus, a polishing agent (6) was obtained. The pH of the polishing agent (6) was 9.1 as shown in Table 1.

Example 7

A solution obtained by adding potassium hydroxide to deionized water and dissolving it in the deionized water was mixed with the cerium oxide dispersion A such that the respective components have the concentrations shown in Table 1. Thus, a polishing agent (7) was obtained. The pH of the polishing agent (7) was 11.5 as shown in Table 1.

Example 8

The cerium oxide dispersion A was added to deionized water so as to have the concentration shown in Table 1. Thus, a polishing agent (8) was obtained. The pH of the polishing agent (8) was 8.2 as shown in Table 1.

Example 9

A polishing agent was prepared without adding a water-soluble polyamine (polyetheramine a) and potassium hydroxide. Specifically, a solution obtained by adding benzoic acid to deionized water was mixed with the cerium oxide dispersion A. Thus, a polishing agent (9) was obtained. Concentrations of the respective components in the polishing agent (9) obtained were as shown in Table 1. The pH of the polishing agent (9) was 5.0 as shown in Table 1.

Polishing characteristics (removal rate of silicon dioxide film, removal rate of silicon nitride film and selection ratio) of the polishing agents (1) to (9) obtained in Examples 1 to 9 were measured with the respective methods described before. For the measurement of polishing characteristics, a silicon dioxide film-attached blanket substrate and a silicon nitride film-attached blanket substrate were used as polishing objects (objects to be polished). The measurement results are shown in Table 1.

TABLE 1

|  | Concentration of cerium oxide (%) | Concentration of water-soluble polyamine (%) | Organic acid | Concentration of organic acid (%) | Concentration of potassium hydroxide (%) | pH | Removal rate of silicon oxide film (nm/min) | Removal rate of silicon nitride film (nm/min) | Selection ratio |
|---|---|---|---|---|---|---|---|---|---|
| Example 1 | 0.25 | 0.12 | Gluconic acid | 0.032 | 0.024 | 11.4 | 170 | 1.4 | 125 |
| Example 2 | 0.25 | 0.06 | Gluconic acid | 0.008 | 0.012 | 11.3 | 130 | 2.3 | 56 |
| Example 3 | 0.25 | 0.06 | Tricine | 0.012 | 0.012 | 11.0 | 127 | 3.4 | 38 |
| Example 4 | 0.25 | 0.06 | — | — | 0.012 | 11.0 | 148 | 7.2 | 21 |
| Example 5 | 0.25 | 0.06 | Gluconic acid | 0.008 | — | 10.4 | 14 | 1.0 | 14 |
| Example 6 | 0.25 | 0.06 | Gluconic acid | 0.008 | 0.012 | 9.1 | 89 | 1.6 | 55 |
| Example 7 | 0.25 | — | — | — | 0.016 | 11.5 | 199 | 14.0 | 15 |
| Example 8 | 0.25 | — | — | — | — | 8.2 | 234 | 9.2 | 25 |
| Example 9 | 0.25 | — | Benzoic acid | 0.100 | — | 5.0 | 28 | 7.2 | 4 |

It can be seen from Table 1 that when polishing is performed using the polishing agents (1) to (3) of Examples 1 to 3 containing cerium oxide particles, polyether polyamine as a water-soluble polyamine, potassium hydroxide, an organic acid and water and having a pH of 10 or more, high removal rate to a silicon dioxide film is obtained, and a selection ratio between a silicon dioxide film and a silicon nitride film becomes high.

On the other hand, it can be seen that when polishing is performed using the polishing agent (4) of Example 4, the polishing agent (7) of Example 7 and the polishing agent (8) of Example 8, that do not contain an organic acid, a selection ratio between a silicon dioxide film and a silicon nitride film is decreased as compared with the case of using the polishing agents (1) to (3) of Examples 1 to 3. Additionally, it can be seen that when polishing is performed using the polishing agent (5) of Example 5, that does not contain potassium hydroxide, a removal rate to a silicon dioxide film is remarkably decreased and a selection ratio between a silicon dioxide film and a silicon nitride film is also greatly decreased, as compared with the case of using the polishing agents (1) to (3) of Examples 1 to 3.

When polishing is performed using the polishing agent (6) of Example 6 containing cerium oxide particles, polyether polyamine as a water-soluble polyamine, potassium hydroxide, an organic acid and water and having a pH adjusted to 9.1, a removal rate to a silicon dioxide film is greatly decreased as compared with the case of using the polishing agents (1) to (3) of Examples 1 to 3.

Additionally, it can be seen that when polishing is performed using the polishing agent (9) that does not contain polyether polyamine as a water-soluble polyamine and potassium hydroxide and has a pH of 5.0, not only a removal rate to a silicon dioxide film is low, but also a selection ratio between a silicon dioxide film and a silicon nitride film is remarkably decreased.

The present application is based on Japanese Patent Application No. 2015-025638 filed on Feb. 12, 2015 and Japanese Patent Application No. 2015-211386 filed on Oct. 28, 2015, and the contents are incorporated herein by reference.

According to the present invention, low removal rate to a silicon nitride film is kept and high selection ratio between a silicon oxide film and a silicon nitride film can be achieved, while maintaining sufficiently high removal rate to a silicon oxide film in, for example, CMP of a surface to be polished which includes a surface including silicon oxide. Therefore, the polishing agent and the polishing method of the present invention are suitable for flattening of an insulating film for STI in the manufacturing of a semiconductor device.

DESCRIPTION OF REFERENCE NUMERALS AND SIGNS

1: Silicon substrate
2: Silicon nitride film
3: Trench
4: Silicon dioxide film
20: Polishing machine
21: Semiconductor substrate
22: Polishing head
23: Polishing platen
24: Polishing pad
25: Polishing agent
26: Polishing agent supply tube

What is claimed is:

1. A polishing agent comprising:
cerium oxide particles;
a water-soluble polyamine;
potassium hydroxide;
at least one selected from an organic acid and a salt thereof; and
water,
wherein the polishing agent has a pH of 10 or more,
the water-soluble polyamine is a water-soluble polyether polyamine having a weight average molecular weight of from 100 to 2,000, and
the organic acid comprises gluconic acid or N-[tris(hydroxymethyl)methyl]glycine.

2. The polishing agent according to claim 1, wherein an amount of the water-soluble polyamine is from 0.001 to 2.0 mass % based on a total amount of the polishing agent.

3. The polishing agent according to claim 1, wherein the organic acid further comprises a monocarboxylic acid.

4. The polishing agent according to claim 1, wherein an amount of the at least one selected from the organic acid and the salt thereof is from 0.001 to 2.0 mass % based on a total amount of the polishing agent.

5. The polishing agent according to claim 1, wherein an amount of the potassium hydroxide is from 0.001 to 2.0 mass % based on a total amount of the polishing agent.

6. The polishing agent according to claim 1, wherein an amount of the cerium oxide particles is from 0.01 to 5.0 mass % based on a total amount of the polishing agent.

7. A polishing agent comprising:
cerium oxide particles;
a water-soluble polyamine;
potassium hydroxide;
at least one selected from an organic acid and a salt thereof; and
water,
wherein the polishing agent has a pH of 10 or more,
the water-soluble polyamine is a water-soluble polyether polyamine having a weight average molecular weight of from 100 to 2,000, and
an amount of the at least one selected from the organic acid and the salt thereof is from 0.001 to 2.0 mass % based on a total amount of the polishing agent.

8. The polishing agent according to claim 7, wherein an amount of the water-soluble polyamine is from 0.001 to 2.0 mass % based on the total amount of the polishing agent.

9. The polishing agent according to claim 7, wherein the organic acid further comprises a monocarboxylic acid.

10. The polishing agent according to claim 7, wherein an amount of the potassium hydroxide is from 0.001 to 2.0 mass % based on the total amount of the polishing agent.

11. The polishing agent according to claim 7, wherein an amount of the cerium oxide particles is from 0.01 to 5.0 mass % based on the total amount of the polishing agent.

12. A polishing method comprising:
supplying the polishing agent according to claim 1 to a polishing pad; and
bringing the polishing pad into contact with a surface to be polished to perform polishing by relative movement therebetween,
wherein material of the surface to be polished comprises silicon oxide.

13. A method for manufacturing a semiconductor integrated circuit device, comprising polishing a surface to be polished of a semiconductor integrated circuit device, by the polishing method according to claim 12.

14. A polishing method comprising:
supplying the polishing agent according to claim 7 to a polishing pad; and
bringing the polishing pad into contact with a surface to be polished to perform polishing by relative movement therebetween,
wherein material of the surface to be polished comprises silicon oxide.

15. A method for manufacturing a semiconductor integrated circuit device, comprising polishing a surface to be polished of a semiconductor integrated circuit device, by the polishing method according to claim 14.

* * * * *